(12) United States Patent
Hung et al.

(10) Patent No.: US 9,054,172 B2
(45) Date of Patent: Jun. 9, 2015

(54) SEMICONDUCTOR STRUCTURE HAVING CONTACT PLUG AND METHOD OF MAKING THE SAME

(71) Applicant: UNITED MICROELECTRNICS CORP., Hsin-Chu (TW)

(72) Inventors: Ching-Wen Hung, Tainan (TW);
Chih-Sen Huang, Tainan (TW);
Po-Chao Tsao, New Taipei (TW);
Chieh-Te Chen, Kaohsiung (TW)

(73) Assignee: UNITED MICROELECTRNICS CORP., Science-Based Industrial Park, Hsin-Chu (TW)

( * ) Notice: Subject to any disclaimer, the term of this patent is extended or adjusted under 35 U.S.C. 154(b) by 33 days.

(21) Appl. No.: 13/705,175

(22) Filed: Dec. 5, 2012

(65) Prior Publication Data

US 2014/0151763 A1     Jun. 5, 2014

(51) Int. Cl.
| | |
|---|---|
| *H01L 29/772* | (2006.01) |
| *H01L 29/78* | (2006.01) |
| *H01L 21/768* | (2006.01) |
| *H01L 23/485* | (2006.01) |
| H01L 29/417 | (2006.01) |
| H01L 23/532 | (2006.01) |
| H01L 29/66 | (2006.01) |
| H01L 29/165 | (2006.01) |

(52) U.S. Cl.
CPC .......... *H01L 29/78* (2013.01); *H01L 21/768 77* (2013.01); *H01L 29/41725* (2013.01); *H01L 29/41783* (2013.01); *H01L 23/485* (2013.01); H01L 23/53223 (2013.01); *H01L 23/53238* (2013.01); H01L 23/53266 (2013.01); *H01L 29/665* (2013.01); *H01L 29/66545* (2013.01); *H01L 29/66575* (2013.01); *H01L 29/7843* (2013.01); *H01L 29/7845* (2013.01); *H01L 29/7848* (2013.01); H01L 29/165 (2013.01); H01L 2924/0002 (2013.01)

(58) Field of Classification Search
CPC ................... H01L 29/41783; H01L 29/41725; H01L 29/4178; H01L 29/78; H01L 29/665
USPC .................. 438/286, 300, 299; 257/382, 383, 257/E29.116
See application file for complete search history.

(56) References Cited

U.S. PATENT DOCUMENTS

| | | | |
|---|---|---|---|
| 5,892,282 | A | 4/1999 | Hong |
| 5,998,873 | A | 12/1999 | Blair |
| 6,033,963 | A | 3/2000 | Huang |
| 6,066,533 | A | 5/2000 | Yu |
| 6,096,659 | A | 8/2000 | Gardner |
| 6,177,303 | B1 | 1/2001 | Schmitz |
| 6,303,418 | B1 | 10/2001 | Cha |

(Continued)

*Primary Examiner* — Brook Kebede
*Assistant Examiner* — Maria Ligai
(74) *Attorney, Agent, or Firm* — Winston Hsu; Scott Margo

(57) ABSTRACT

The present invention provides a semiconductor structure including a substrate, a transistor, a first ILD layer, a second ILD layer, a first contact plug, second contact plug and a third contact plug. The transistor is disposed on the substrate and includes a gate and a source/drain region. The first ILD layer is disposed on the transistor. The first contact plug is disposed in the first ILD layer and a top surface of the first contact plug is higher than a top surface of the gate. The second ILD layer is disposed on the first ILD layer. The second contact plug is disposed in the second ILD layer and electrically connected to the first contact plug. The third contact plug is disposed in the first ILD layer and the second ILD layer and electrically connected to the gate. The present invention further provides a method of making the same.

10 Claims, 5 Drawing Sheets

(56) References Cited

U.S. PATENT DOCUMENTS

| | | |
|---|---|---|
| 6,458,684 B1 | 10/2002 | Guo |
| 6,492,217 B1 | 12/2002 | Bai |
| 6,552,377 B1 | 4/2003 | Yu |
| 6,573,134 B2 | 6/2003 | Ma |
| 6,653,698 B2 | 11/2003 | Lee |
| 6,696,345 B2 | 2/2004 | Chau |
| 6,790,719 B1 | 9/2004 | Adetutu |
| 6,794,234 B2 | 9/2004 | Polishchuk |
| 6,858,483 B2 | 2/2005 | Doczy |
| 6,902,969 B2 | 6/2005 | Adetutu |
| 6,921,711 B2 | 7/2005 | Cabral, Jr. |
| 6,953,719 B2 | 10/2005 | Doczy |
| 6,960,416 B2 | 11/2005 | Mui |
| 6,967,131 B2 | 11/2005 | Saenger |
| 6,972,225 B2 | 12/2005 | Doczy |
| 7,029,966 B2 | 4/2006 | Amos |
| 7,030,430 B2 | 4/2006 | Doczy |
| 7,056,794 B2 | 6/2006 | Ku |
| 7,064,050 B2 | 6/2006 | Cabral, Jr. |
| 7,064,066 B1 | 6/2006 | Metz |
| 7,074,664 B1 | 7/2006 | White |
| 7,074,680 B2 | 7/2006 | Doczy |
| 7,109,079 B2 | 9/2006 | Schaeffer, III |
| 7,112,851 B2 | 9/2006 | Saenger |
| 7,126,199 B2 | 10/2006 | Doczy |
| 7,144,783 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,176,090 B2 | 2/2007 | Brask |
| 7,183,184 B2 | 2/2007 | Doczy |
| 7,186,605 B2 | 3/2007 | Cheng |
| 7,193,893 B2 | 3/2007 | Forbes |
| 7,208,361 B2 | 4/2007 | Shah |
| 7,208,366 B2 | 4/2007 | Tsai |
| 7,214,620 B2 | 5/2007 | Kim |
| 7,217,611 B2 | 5/2007 | Kavalieros |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,556,998 B2 | 7/2009 | Park |
| 7,700,479 B2 | 4/2010 | Huang |
| 7,785,958 B2 | 8/2010 | Doczy |
| 8,492,228 B1 * | 7/2013 | Leobandung et al. ........ 438/275 |
| 2002/0096734 A1 * | 7/2002 | Natsume ...................... 257/508 |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0039433 A1 | 2/2009 | Yang |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2010/0040768 A1 | 2/2010 | Dhindsa |
| 2010/0044783 A1 | 2/2010 | Chuang |
| 2010/0052066 A1 | 3/2010 | Yu |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0244141 A1 | 9/2010 | Beyer |
| 2010/0283152 A1 | 11/2010 | Chen |
| 2012/0056245 A1 * | 3/2012 | Kang et al. .................. 257/192 |
| 2012/0104471 A1 * | 5/2012 | Chang et al. ................ 257/288 |

* cited by examiner

SEMICONDUCTOR STRUCTURE HAVING CONTACT PLUG AND METHOD OF MAKING THE SAME

BACKGROUND OF THE INVENTION

1. Field of the Invention

The present invention relates to a semiconductor structure having at least a contact plug, and a method of making the same, and more particularly, to a semiconductor structure having a gate and a first contact plug, wherein a top surface of the first contact plug is higher than a top surface of the gate.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that is suitable for use as the high-k gate dielectric layer.

In addition, in conventional arts, after forming the transistor with a metal gate, a wiring system is formed thereabove to electrically connect the metal gate and the source/drain, thereby providing a signal input/output pathway for the transistor. However, the wiring system connecting the source/drain in conventional arts usually includes a plurality of contacts plugs, resulting in a problem of high resistance and low electrical performance. Furthermore, as the miniaturization of the devices, a problem of electrical short between the metal gate and the contact plug connecting the source/drain is easy to occur and the quality of the device is decreased as well. Consequently, there is still a need for a novel semiconductor structure having at least a contact plug to resolve the above-mentioned problem.

SUMMARY OF THE INVENTION

The present invention therefore provides a semiconductor structure having at least a contact plug and a method of making the same, which is able to improve the overall electrical performance of the devices.

According to one embodiment, the present invention provides a semiconductor structure including at least a contact plug. The structure includes a substrate, a transistor, a first ILD (inter-layer dielectric) layer, a second ILD layer, a first contact plug, second contact plug and a third contact plug. The transistor is disposed on the substrate and includes a gate and a source/drain region. The first ILD layer is disposed on the transistor. The first contact plug is disposed in the first ILD layer and a top surface of the first contact plug is higher than a top surface of the gate. The second ILD layer is disposed on the first ILD layer. The second contact plug is disposed in the second ILD layer and electrically connected to the first contact plug. The third contact plug is disposed in the first ILD layer and the second ILD layer and electrically connected to the gate.

According to another embodiment, the present invention provides a method of forming a semiconductor structure including at least a contact plug. A substrate is provided, and a transistor is formed on the substrate. The transistor includes a gate and a source/drain region. A first ILD layer is formed on the substrate. A first contact plug is formed in the first ILD layer and a top surface of the first contact plug is higher than a top surface of the gate. A second ILD layer is formed on the first ILD layer. Lastly, a second contact plug is formed in the second ILD layer to electrically connect the first contact plug, and a third contact plug is formed in the second ILD layer and the first ILD layer to electrically connect the gate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
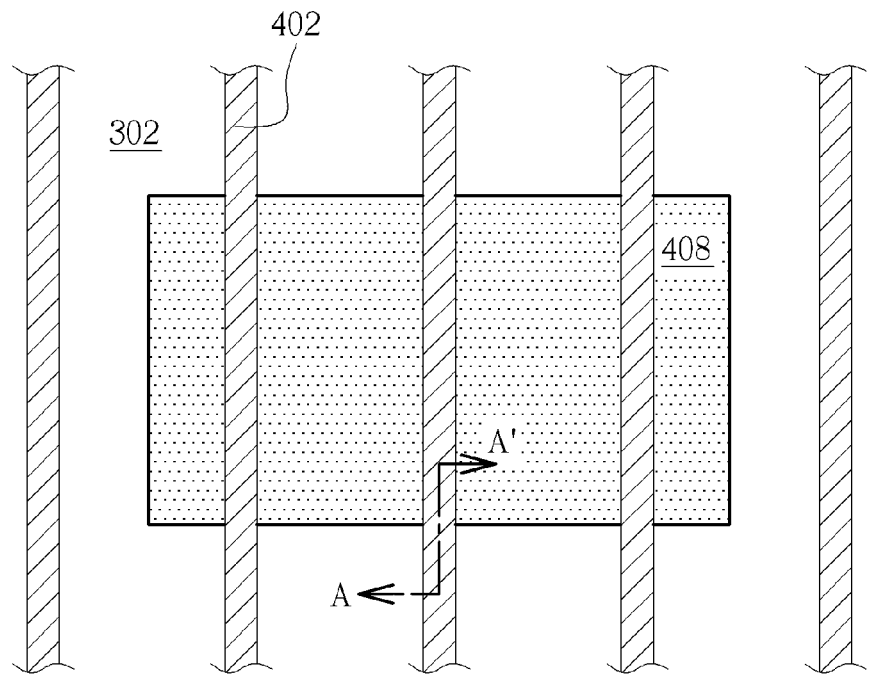
FIG. 1 to FIG. 10 show schematic diagrams of the method of forming the semiconductor structure having at least a contact plug in the present invention.
Figure 2:
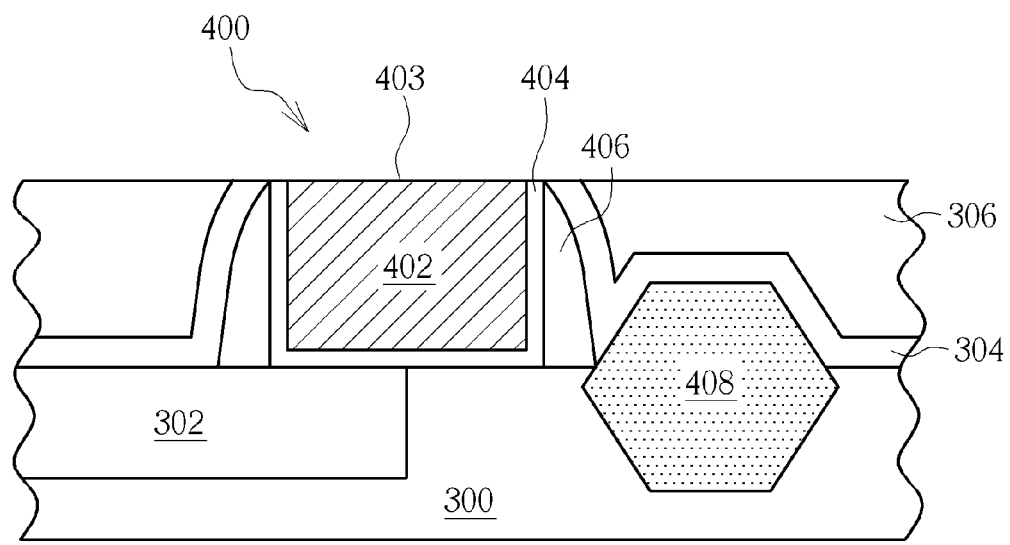
Figure 7:
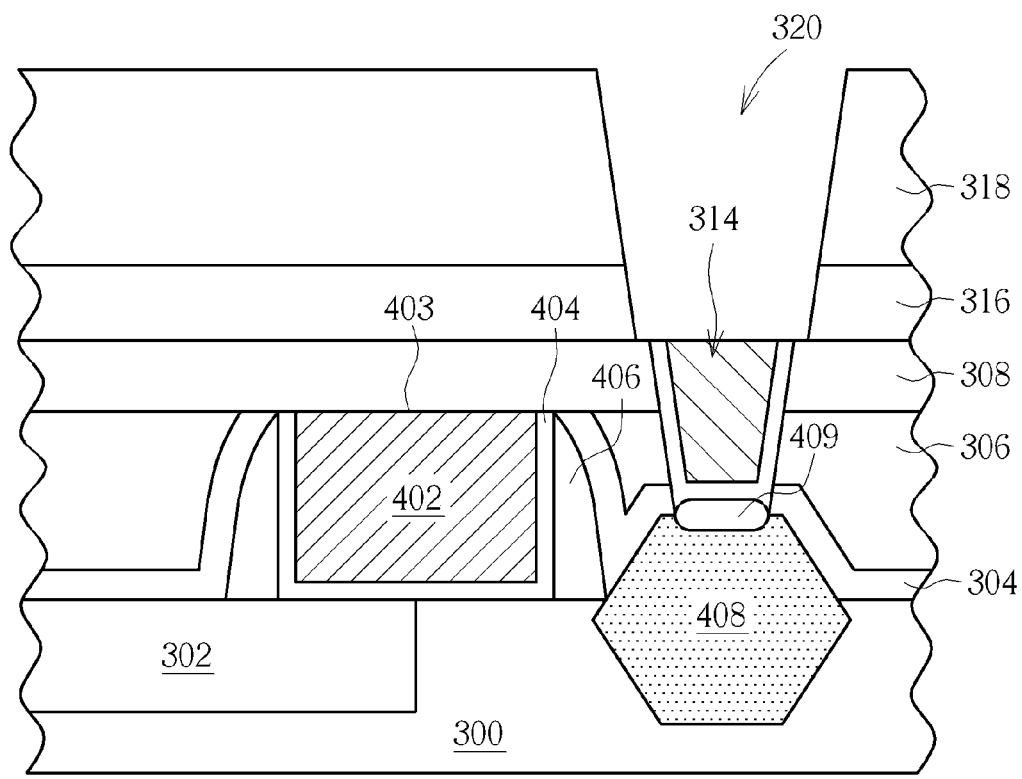
Figure 8:
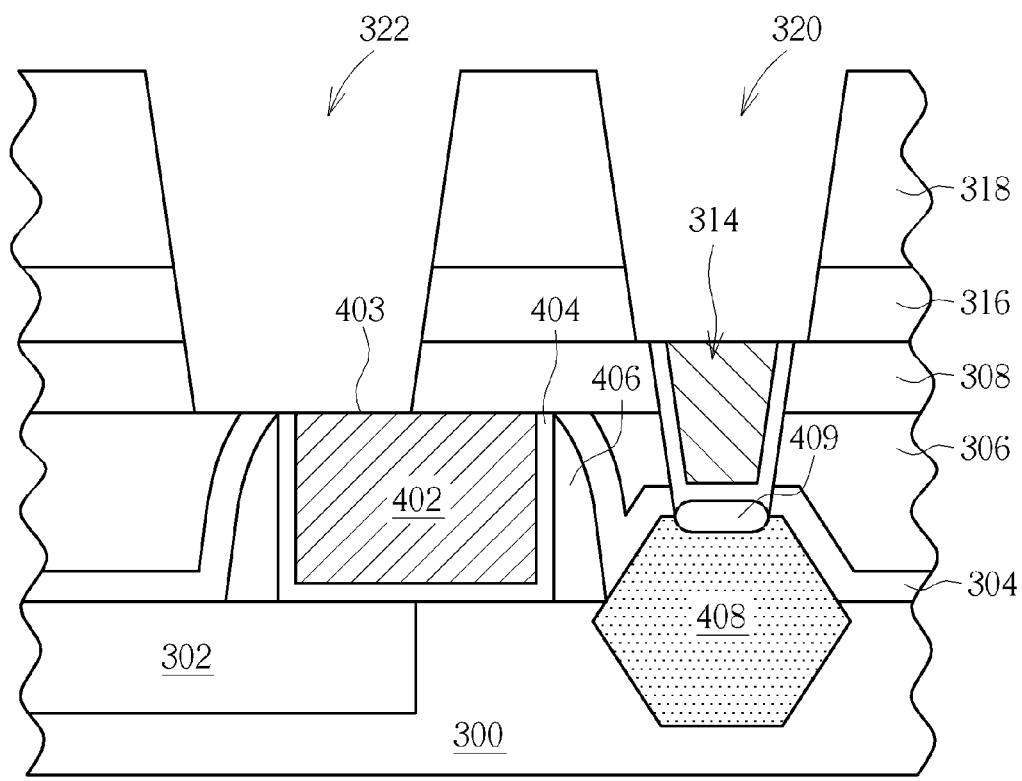
Figure 9:
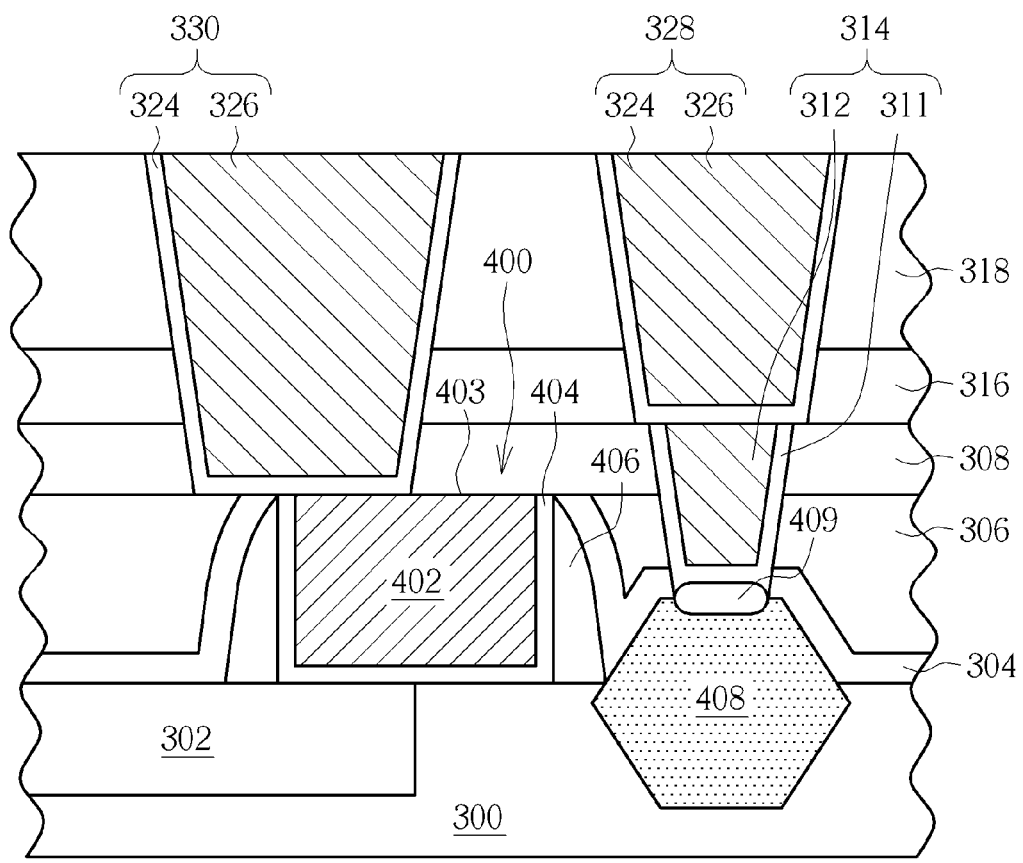
Figure 10:
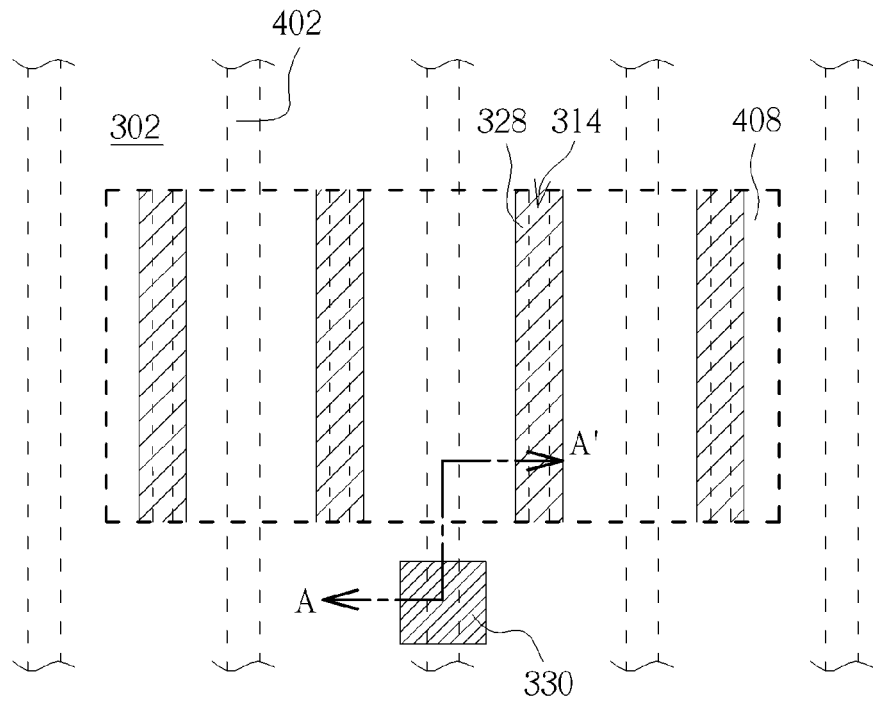

Please refer to FIG. 1 to FIG. 10, which show schematic diagrams of the method of forming a semiconductor structure having at least a contact plug in the present invention, wherein FIG. 2 is a cross sectional view taken along line AA' of FIG. 1, and FIG. 9 is a cross sectional view taken along line AA' of FIG. 10. As shown in FIG. 1 and FIG. 2, a substrate 300 is provided, and a plurality of shallow trench isolations (STI) 302 are formed on substrate 300. The substrate 300 can be a silicon substrate, an epitaxial silicon substrate, a silicon germanium substrate, a silicon carbide substrate or a silicon-on-insulator (SOI) substrate, but is not limited thereto. A transistor 400 is then formed on the substrate 300. The transistor 400 includes a gate 402 and a source/drain region 408. In one preferred embodiment of the present invention, the transistor 400 is formed by a "gate last" semiconductor manufacturing process and includes a metal gate 402. For example, a dummy gate (not shown) is formed on the substrate 300, and then a spacer 406, a source/drain region 408, a contact etch stop layer (CESL) 304 and a dielectric layer 306 are sequentially formed on the substrate 300. Next, the dummy gate is removed to form a trench (not shown), which is subsequently filled with a gate dielectric layer 404 and a gate 402. A planarization process is further performed to make a top surface 403 of the gate 402 level with the dielectric layer 306. In one embodiment, as shown in FIG. 2, the gate dielectric layer 404 has a "U-shaped" cross section and the material thereof include $SiO_2$ or high-k materials. The gate 402 can contain one or a plurality of metal layers, for example, a work function metal layer, a barrier layer and a low-resistance metal layer.

Figure 3:
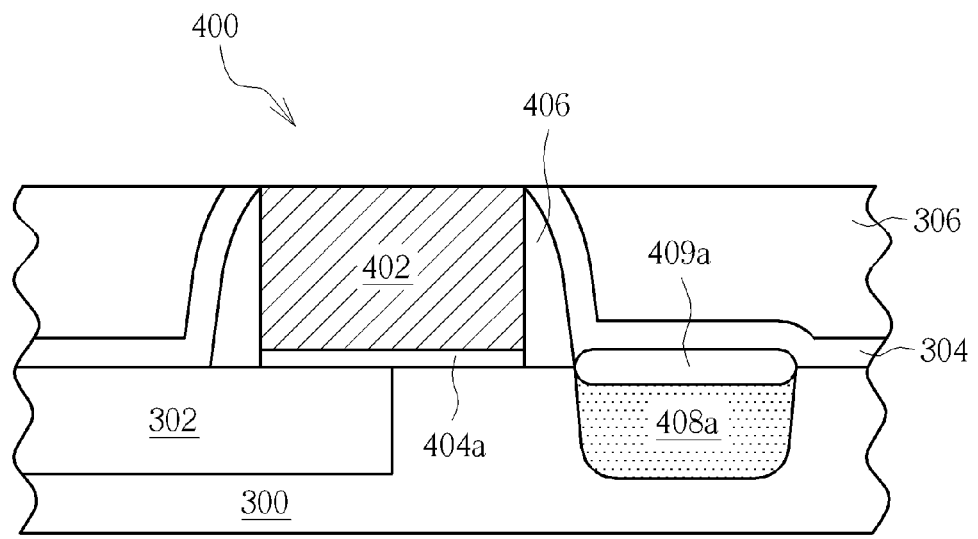

It is worth noting that each component of the transistor 400 can have different embodiments according to different designs of the devices. For example, as shown in FIG. 2, the source/drain region 408 can contain a SiGe layer for PMOS or a SiC layer for NMOS, which is formed by a selective epitaxial growth (SEG) process. In one preferred embodiment, the epitaxial layer of the source/drain region 408 extends upwardly from the substrate 300 and downwardly into the substrate 300. In one embodiment, the epitaxial layer has a hexagonal (also called "sigma Σ") or an octagonal cross section, in which a flat bottom surface of the epitaxial layer is disposed in the substrate 300. In another embodiment, the epitaxial layer extends under the spacer 406 to further enhance the stress effect. In another embodiment, the CESL 304 can also provide a stress so as to form a selective strain scheme (SSS). In another embodiment, as shown in FIG. 3, the gate dielectric layer 404a is formed by a "high-k first" process (that is, the gate dielectric layer is formed before the dummy gate) and therefore has a "—" shape in its cross section, which is different form the "U" shape of the embodiment in FIG. 2, which is formed by a "high-k last" process (that is, the gate dielectric layer is formed after removing the dummy gate). In another embodiment, a silicide layer 409a can be formed on the source/drain region 408a. The above embodiments are only shown for example. The transistor 400 in the present invention can have a variety of embodiments, which are not described for the sake of simplicity. The following description is based on the embodiment shown in FIG. 2.

Figure 4:
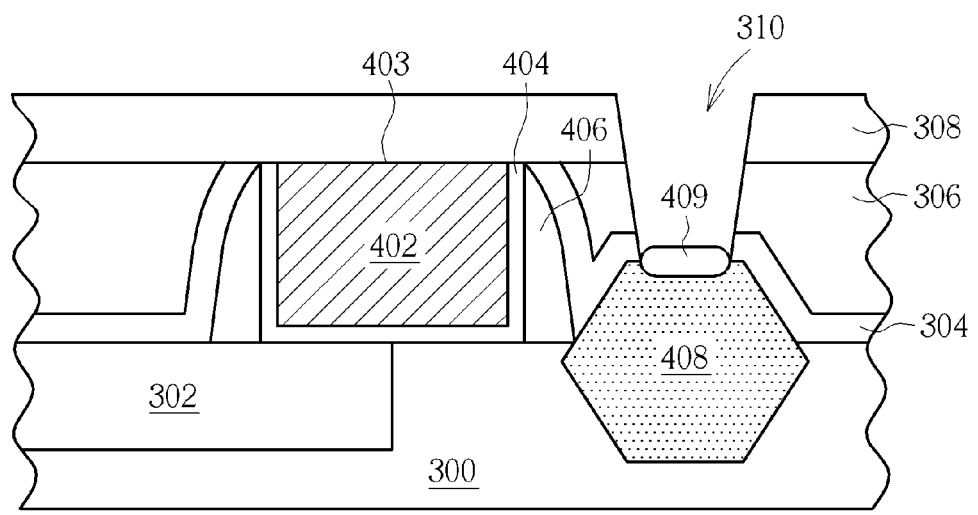

As shown in FIG. 4, a first ILD (inter-layer dielectric) layer 308 is formed on the substrate 300, and a first opening 310 is then formed in the dielectric layer 306 and first ILD layer 308 to expose the source/drain region 408. The step of forming the first opening 310 includes forming a first photoresist layer (not shown) and a first mask layer (not shown) on the first ILD layer 308, and at least one lithography step and an etching process are performed to respectively pattern the first photoresist layer and the first mask layer. The first photoresist layer is then removed and an etching process is carried out to form the first opening 310 by using the patterned mask layer as a mask. In one embodiment of the present invention, the first photoresist layer and the first mask layer can have different embodiments depending on the process technology. For example, the first photoresist layer is a photoresist material suitable for light source having a wavelength of 193 nm, and a bottom anti-reflection coating (BARC) can be formed under the photoresist layer. The first mask layer may be one single layer or multi layers, which are made of various kinds of hard mask materials, such as silicon nitride (SiN), silicon oxynitride (SiON), silicon carbide (SiC) or carbon-containing organic material, such as advanced pattern film (APF) supplied by the Applied Materials company. In one preferred embodiment, the mask layer can include silicon-containing hard-mask bottom anti-reflection coating (SHB) layer and organic dielectric layer (ODL) provided by Shin-Etsu Chemical Co. Ltd., wherein the SHB layer is disposed directly under the photoresist layer to serve as a BARC and a mask layer, and the ODL layer is an organic underlayer, i.e., a hydrocarbon, which is used to serves as a final mask layer.

In one embodiment, after forming the first opening 310, a salicidation process can be performed to forming a silicide layer 409 such as a nickel silicide (NiSi) layer on the source/drain region 408 exposed by the first opening 310. In another embodiment of the present invention as shown in FIG. 3, since the silicide layer 409a has been formed on the source/drain region 408a before the formation of the first opening, the step of forming the silicide layer can be omitted.

Figure 5:
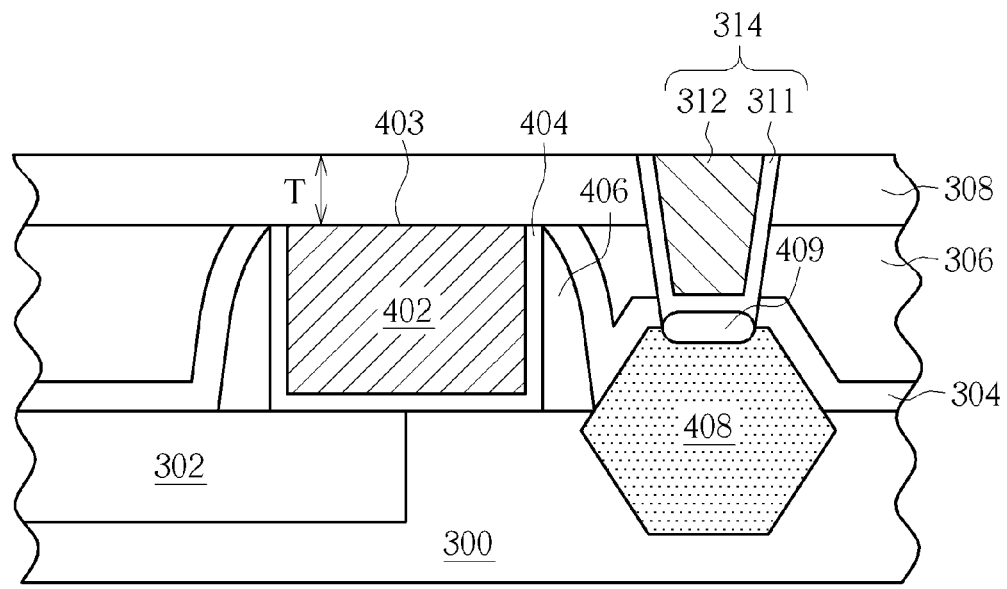

As shown in FIG. 5, a first contact plug 314 is formed in the first opening 310. For example, a first barrier layer 311 and a first metal layer 312 are sequentially filled into the first opening 310, wherein the first barrier layer 311 is formed conformally along the surface of the first opening 310, and the first metal layer 312 completely fills the first opening 310. In one embodiment, the first barrier layer 311 can include titanium (Ti), titanium nitride (TiN) or tantalum nitride (TaN) or a plurality of metal layers such as Ti/TiO, but is not limited thereto. The first metal layer 312 can include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and most preferably tungsten, which can form suitable Ohmic contact between the first metal layer 312 and the silicide layer 409 or the below source/drain region 408. In one embodiment, the first contact plug 314 can have appropriate stress. The tensile or compressive stress from the first metal layer 312 of the first contact plug 314 can cause stress on the source/drain region 408, thereby improving the electrical performance of the transistor 400. Thereafter, a planarization step, such as a chemical mechanical polish (CMP) process or an etching back process or their combination, can be performed to remove the first metal layer 312 and the first barrier layer 311 outside the first opening 310, and further remove the first ILD layer 308 to a predetermined thickness T. As shown in FIG. 5, after the planarization process, the top surface 403 of the gate 402 is not exposed and is still covered by the first ILD layer 308 having the predetermined thickness T. In one embodiment, the predetermined thickness T is greater than 100 angstroms, preferably between 100 to 500 angstroms, and most preferably between 100 to 300 angstroms.

Figure 6:
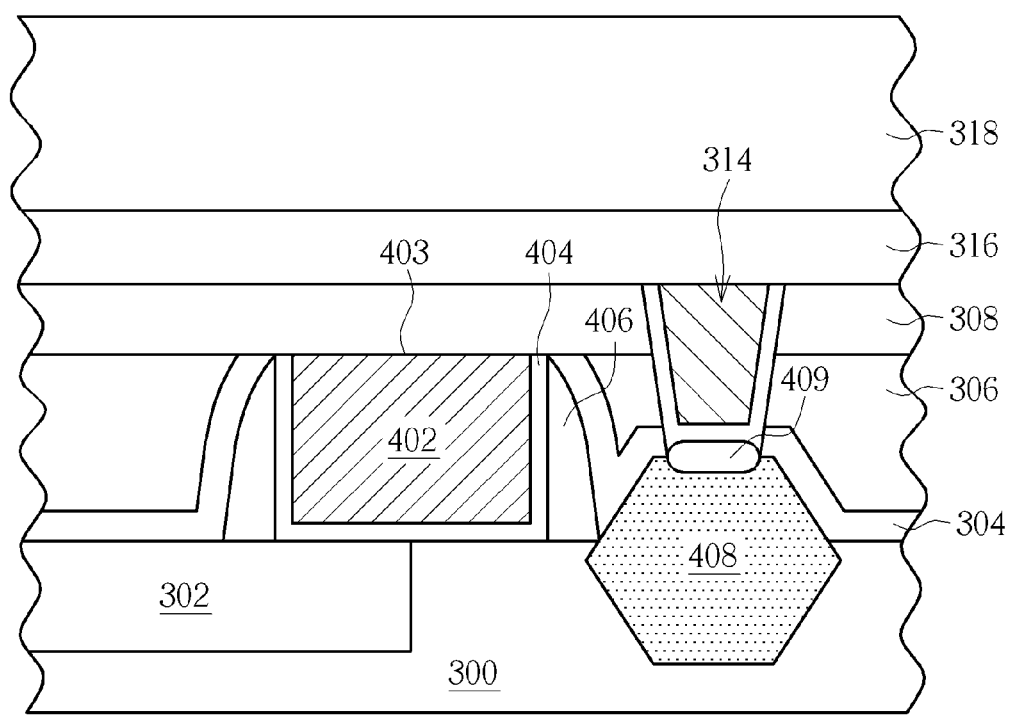

As shown in FIG. 6, an etch stop layer 316 and a second ILD layer 318 are formed on the substrate 300. In one preferred embodiment of the present invention, the etch stop layer 316 is, for example, a nitrogen-containing layer or a carbon-containing layer, such as SiN, SiC or SiCN. The second ILD layer 318 can contain one or more than one dielectric layers, which may be formed by a chemical vapor deposition (CVD) process, a spin coating process, or other suitable process that can form any dielectric materials. In one embodiment of the present invention, the etch stop layer 316 can be omitted, that is, the second ILD layer 318 is formed directly on the first ILD layer 308.

As shown in FIG. 7, a lithography and an etching step are performed to form a second opening 320 in the second ILD layer 318 and the etch stop layer 316 to expose the first contact plug 314. In one preferred embodiment, the area of the second opening 320 is larger than that of the first contact plug 314. In one embodiment, the steps for forming the second opening 320 includes forming a second photoresist layer (not shown) and a second mask layer (not shown), wherein the embodiments of the second photoresist layer and the second mask layer are similar to those of the first photoresist layer and the first mask layer, and are not described.

As shown in FIG. 8, a lithography and an etching step are performed to form a third opening 322 in the second ILD layer 318, the etch stop layer 316 and the first ILD layer 308 to expose the top surface 403 of the gate 402. In one embodiment, the steps for forming the third opening 322 includes forming a third photoresist layer (not shown) and a third mask layer (not shown), wherein the embodiments of the third photoresist layer and the third mask layer are similar to those of the first photoresist layer and the first mask layer, and are not described. It is noted that, the third photoresist layer and the third mask layer in one embodiment includes a tri-layered structure of photoresist/SHB/ODL so when forming the third opening 322, the second opening 320 can be completely filled by the ODL layer due to the good filling capability of the ODL layer. After forming the third opening 322, the tri-layered structure of photoresist/SHB/ODL is removed. Subsequently, a cleaning process can be performed optionally. For example, Ar gas is used to clean the surface of the second opening 320 and the third opening 322.

As shown in FIGS. 9 and 10, a second barrier layer 324 and a second metal layer 326 are formed on the substrate 300, wherein the second barrier layer 324 is formed conformally along the surface of the second opening 320 and the third opening 322, and the second metal layer 326 completely fills the second opening 320 and the third opening 322. In one embodiment, the second barrier layer 324 can include Ti, TiN or TaN or a plurality of metal layers such as Ti/TiO, but is not limited thereto. The second metal layer 326 can include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and most preferably copper, so as to reduce the resistance for the gate 402 or the first contact plug 314. Subsequently, a planarization process is performed to remove the second barrier layer 324 and the second metal layer 326 outside the second opening 320 and the third opening 322. Consequently, as shown in FIG. 9, the second barrier layer 324 and the second metal layer 326 in the second opening 320 become a second contact plug 328, and the second metal layer 326 in the third opening 322 become a third contact plug 330.

In another embodiment, the second opening 320 and the third opening 322 can be filled into different barrier layer and metal layer. For example, a sacrifice layer can be filled into the third opening 322. A second barrier layer and a second metal layer can be then filled into the second opening 320. Next, the sacrifice layer in the third opening 322 is removed and another sacrifice layer is formed on the second opening 320. Subsequently, a third metal layer and a third barrier layer is formed in the third opening 322. A planarization process is performed lastly. In this manner, the first contact plug 314, the second contact plug 328 and the third contact plug 330 can have different metal layers filled therein. In one embodiment, the first contact plug 314 and the second contact plug 328 can include tungsten (W), and the third contact plug 330 can include copper (Cu). In another embodiment, the first contact plug 314 can include tungsten (W), and the second contact plug 328 and the third contact plug 330 can include copper (Cu).

In the following steps, a metal interconnect system (not shown), which includes a plurality of inter-metal dielectric (IMD) layers and a plurality of metal layers (so called metal 1, metal 2, and the like), can be further formed above the second ILD layer 318 by a conventional metal interconnection fabrication method. The metal interconnection system electrically connects the gate 402 of the transistor 400 by the third contact plug 330 and electrically connects the source/drain region 408 of the transistor 400 by the first contact 314 and the second contact plug 328, thereby providing a signal input/output pathway for the transistor 400.

By using the fabrication method described above, the first contact plug 314, the second contact plug 328 and the third contact plug 330 can be formed in the dielectric layer 306, the first ILD layer 308 and the second ILD layer 318 (also called metal 0), respectively. As shown in FIG. 9, the present invention provides a semiconductor structure including at least a contact plug. The structure includes a substrate 300, a transistor 400, a first ILD layer 308, a second ILD layer 318, a first contact plug 314, second contact plug 328 and a third contact plug 330. The transistor 400 is disposed on the substrate 300 and includes a gate 402 and a source/drain region 408. The first ILD layer 308 is disposed on the transistor 400. The first contact plug 314 is disposed in the first ILD layer 308 and a top surface of the first contact plug 314 is higher than a top surface 403 of the gate 402. The second ILD layer 318 is disposed on the first ILD layer 308. The second contact plug 328 is disposed in the second ILD layer 318 and electrically connected to the first contact plug 314. The third contact plug 330 is disposed in the first ILD layer 308 and the second ILD layer 318 and electrically connected to the gate 402.

It is one feature of the present invention that when performing the planarization process to form the first contact plug 314 in FIG. 5, the top surface 403 of the gate 402 is not exposed and is still covered by the first ILD layer 308 having a thickness T. In conventional arts, the planarization process is usually performed to expose the gate, so it may cause a lot of damage to the gate. Furthermore, it is also a challenge to the slurry selectivity since the gate, the gate dielectric layer and the first contact plug are polished simultaneously in the planarization process. As a result, by using the method provided by the present invention, the drawbacks in the conventional arts can be avoided. In addition, when forming the second contact plug 328 to contact the first contact plug 314 in FIG. 9, since there is still a height T (the thickness T of the first ILD layer 308) between the bottom of the second contact plug 328 and the top surface 403 of the gate 402, the short phenomenon between the second contact plug 328 and the gate 402 can be avoided and the process window of the manufacturing processes can be upgraded. In this manner, the second contact plug 328 and the third contact plug 330 formed in the subsequent steps have different length. That is, the second contact plug 328 extends in the second ILD layer 318 and the etch stop layer 316, while the third contact plug 330 extends in the second ILD layer 318, the etch stop layer 316 and the first ILD layer 308.

In another embodiment, the first contact plug 314 can have a stress. By using the method in the present invention, the loss of the first contact plug 314 can be reduced and the stress from the first contact plug 314 can be retained. Consequently, the electrical performance of the transistor 400 can be improved.

Another feature of the present invention is that, a lithography and an etch process is performed to form the second opening 320 directly exposing the first contact plug 314, and then another lithography and etching process is performed to form the third opening 322 direct exposing the gate 402. By using the separated forming process, the second contact plug 328 and the third contact plug 330 can be formed precisely on the substrate 300. In another embodiment, the sequence of forming the second opening 320 and the third opening 322 can be altered. For example, a lithography and an etch process is performed to form the third opening 322 directly exposing the gate 402, and then another lithography and etching process is performed to form the second opening 320 direct exposing the first contact plug 314. In addition, the method provided in the present invention can be applied to any kinds of semiconductor devices, such as finFET, tri-gate FET or other non-planar FET, and should also be involved into the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure having at least a contact plug, comprising:
   a substrate;
   a transistor disposed on the substrate, wherein the transistor comprises a gate and a source/drain region;
   a first inter-layer dielectric (ILD) layer disposed on the transistor, wherein a bottom surface of the first ILD layer is level with a top surface of the gate;
   a first contact plug disposed in the first ILD layer to electrically connect the source/drain region, wherein a top surface of the first contact plug is higher than a top surface of the gate;
   a second ILD layer disposed on the first ILD layer;
   a second contact plug disposed in the second ILD layer to electrically connect the first contact plug, wherein a bottom surface of the second contact plug is level with a top surface of the first ILD layer; and a third contact plug disposed in the first ILD layer and the second ILD layer to electrically connect the gate.

2. The semiconductor structure having at least a contact plug as in claim 1, wherein the first ILD layer disposed on the gate has a predetermined thickness, being greater than 100 angstroms.

3. The semiconductor structure having at least a contact plug as in claim 1, wherein the source/drain region comprises an epitaxial layer protruding above the substrate.

4. The semiconductor structure having at least a contact plug as in claim 1, wherein the transistor further comprises a silicide layer disposed between the first contact plug and the source/drain region.

5. The semiconductor structure having at least a contact plug as in claim 1, wherein both the second contact plug and the third contact plug comprise a second metal layer.

6. The semiconductor structure having at least a contact plug as in claim 5, wherein the second metal layer comprises copper (Cu), tungsten (W), aluminum (Al), titanium (Ti), tantalum (Ta), niobium (Nb) or molybdenum (Mo).

7. The semiconductor structure having at least a contact plug as in claim 5, wherein the first contact plug comprises a first metal layer, and the material of the first metal layer is different from that of the second metal layer.

8. The semiconductor structure having at least a contact plug as in claim 1, wherein the first contact plug comprises a first metal layer, the second contact plug comprises a second metal layer and the third metal layer comprises a third metal layer, wherein the materials of the first metal layer, the second metal layer and the third metal layer are different with each other.

9. The semiconductor structure having at least a contact plug as in claim 1, further comprising an etch stop layer disposed between the first ILD layer and the second ILD layer.

10. The semiconductor structure having at least a contact plug as in claim 1, further comprising a dielectric layer having a top surface leveled up with a top surface of the gate, and the first ILD layer directly on the dielectric layer.

* * * * *